(12) United States Patent
Rasouli et al.

(10) Patent No.: US 9,577,635 B2
(45) Date of Patent: Feb. 21, 2017

(54) CLOCK-GATING CELL WITH LOW AREA, LOW POWER, AND LOW SETUP TIME

(71) Applicant: QUALCOMM Incorporated, San Diego, CA (US)

(72) Inventors: Seid Hadi Rasouli, San Diego, CA (US); Steven James Dillen, San Diego, CA (US); Animesh Datta, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/598,182

(22) Filed: Jan. 15, 2015

(65) Prior Publication Data

US 2016/0211846 A1    Jul. 21, 2016

(51) Int. Cl.
  *H03K 17/687* (2006.01)
  *H03K 17/60* (2006.01)
  *H03K 19/00* (2006.01)

(52) U.S. Cl.
  CPC ...... *H03K 19/0016* (2013.01); *H03K 17/6872* (2013.01)

(58) Field of Classification Search
  CPC .. H03K 23/68; H03K 23/667; H03K 5/00006; G06F 7/68; G06F 1/08
  USPC ................. 327/115, 117, 434, 436
  See application file for complete search history.

(56) References Cited

U.S. PATENT DOCUMENTS

| 7,116,150 B2 | 10/2006 | Francom |
| 7,576,582 B2 | 8/2009 | Lee et al. |
| 7,639,057 B1 * | 12/2009 | Su ............................. G06F 1/10 326/93 |
| 7,779,372 B2 | 8/2010 | Campbell et al. |
| 7,825,689 B1 | 11/2010 | Vasishta et al. |
| 7,902,878 B2 | 3/2011 | Saint-Laurent et al. |
| 8,030,982 B2 | 10/2011 | Datta et al. |
| 8,575,965 B2 | 11/2013 | Liu et al. |
| 9,270,270 B2 | 2/2016 | Cai et al. |

(Continued)

FOREIGN PATENT DOCUMENTS

WO    2014043856 A1    3/2014

OTHER PUBLICATIONS

International Search Report and Written Opinion—PCT/US2015/066116—ISA/EPO—Jul. 13, 2016.

*Primary Examiner* — Lincoln Donovan
*Assistant Examiner* — Diana J Cheng
(74) *Attorney, Agent, or Firm* — Arent Fox LLP (57) ABSTRACT

A CGC includes an enable module and a latch module. The enable module has an enable module input and an enable module output. The latch module has latch module inputs and a latch module output. The latch module inputs include a latch module clock input for receiving a clock and a latch module enable input for receiving the enable module output. The latch module enable input is coupled to the enable module output. The latch module is configured to enable and to disable the clock via the latch module output based on the enable module input. The latch module includes an internal enable node that is the latch module output. The latch module is configured to cause the internal enable node to transition from low to high as a function of the enable module output and $\overline{EC}$, where E is the internal enable node and C is the clock.

29 Claims, 7 Drawing Sheets

(56) References Cited

U.S. PATENT DOCUMENTS

| | | | |
|---|---|---|---|
| 2002/0000833 A1* | 1/2002 | Taki | H01L 27/0207 |
| | | | 326/102 |
| 2007/0008024 A1 | 1/2007 | Cheng | |
| 2010/0109747 A1* | 5/2010 | Datta | H03K 3/356086 |
| | | | 327/379 |
| 2012/0249181 A1 | 10/2012 | Kanari | |
| 2012/0299622 A1* | 11/2012 | Liu | G06F 1/3237 |
| | | | 326/98 |
| 2014/0070847 A1 | 3/2014 | Elkin et al. | |
| 2014/0184271 A1 | 7/2014 | Gurumurthy et al. | |

* cited by examiner

CLOCK-GATING CELL WITH LOW AREA, LOW POWER, AND LOW SETUP TIME

BACKGROUND

Field

The present disclosure relates generally to clock-gating cells, and more particularly, to clock-gating cells with low area, low power, and low setup time.

Background

A clock-gating cell is a cell that gates a clock in order to reduce dynamic power dissipation in components that receive the clock. By gating the clock, the clock may be turned on/off. For components that receive the clock, but are being unutilized in an integrated circuit (IC), one or more clock-gating cells may be used to switch off the clock so as to avoid switching states and consuming power within the unutilized components that receive the clock in the IC. Many clock-gating cells may be used within an IC. Clock-gating cells with low area, low power, and/or low setup time are needed.

SUMMARY

In an aspect of the disclosure, a clock-gating cell includes an enable module and a latch module. The enable module includes a NOR gate that receives an enable module input and has an enable module output. The latch module has latch module inputs and a latch module output. The latch module inputs include a latch module clock input for receiving a clock and a latch module enable input for receiving the enable module output. The latch module enable input is coupled to the enable module output. The latch module is configured to enable and to disable the clock via the latch module output based on the enable module input. The latch module includes a first p-type metal oxide semiconductor (pMOS) transistor having a first pMOS transistor source, a first pMOS transistor drain, and a first pMOS transistor gate. The first pMOS transistor source is coupled to a first voltage source. The first pMOS transistor drain is coupled to a first node. The latch module further includes a second pMOS transistor having a second pMOS transistor source, a second pMOS transistor drain, and a second pMOS transistor gate. The second pMOS transistor source is coupled to the first node. The second pMOS transistor drain is coupled to an internal enable node. The internal enable node is the latch module output. The second pMOS transistor gate is coupled to the enable module output.

In an aspect of the disclosure, a clock-gating cell includes an enable module and a latch module. The enable module has an enable module input and an enable module output. The latch module has latch module inputs and a latch module output. The latch module inputs include a latch module clock input for receiving a clock and a latch module enable input for receiving the enable module output. The latch module enable input is coupled to the enable module output. The latch module is configured to enable and to disable the clock via the latch module output based on the enable module input. The latch module includes an internal enable node that is the latch module output. The latch module is configured to cause the internal enable node to transition from low to high as a function of the enable module output and $\overline{EC}$, where E is the internal enable node and C is the clock.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

Figure 1:
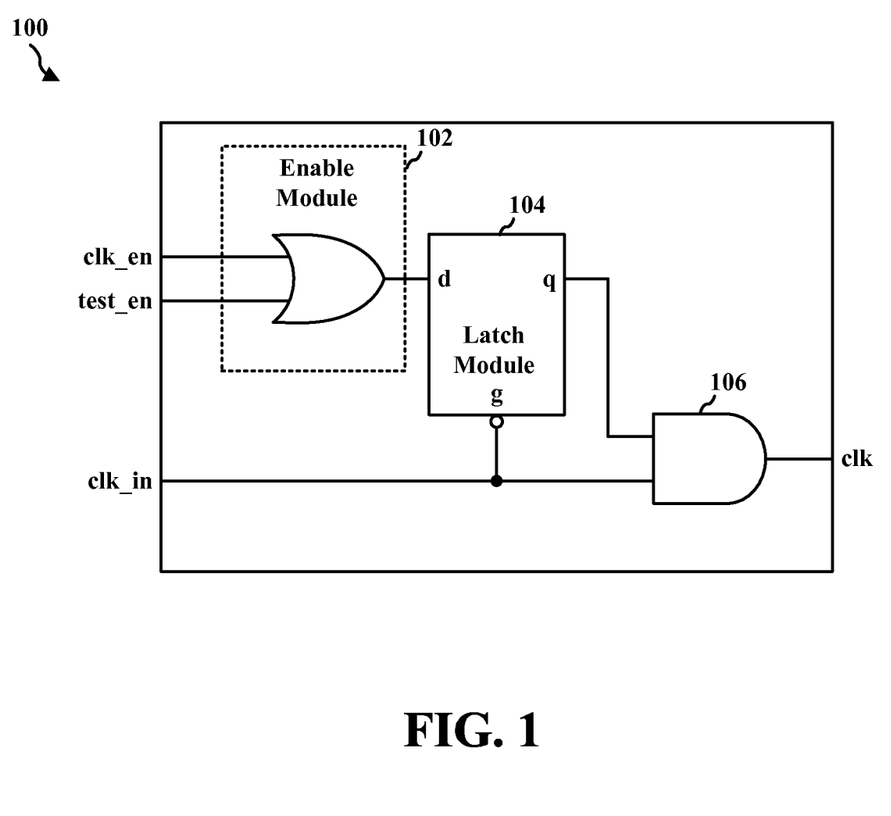
FIG. 1 is a diagram illustrating a clock-gating cell.

FIG. 1 is a diagram illustrating a clock-gating cell 100. As shown in FIG. 1, a clock-gating cell (CGC) 100 includes an enable module 102 and a latch module 104. The enable module 102 may receive inputs clk_en (clock enable) for enabling/disabling the clk_in (clock) based on clk_en (e.g., during functional mode) and a test_en (test enable) for enabling/disabling the clk_in based on test_en (e.g., during test mode). An output of the enable module 102 is input to the latch module 104. The latch module 104 latches either a 0 or a 1 to disable or to enable, respectively, the clk_in input from propagating through the AND gate 106.

Figure 2:
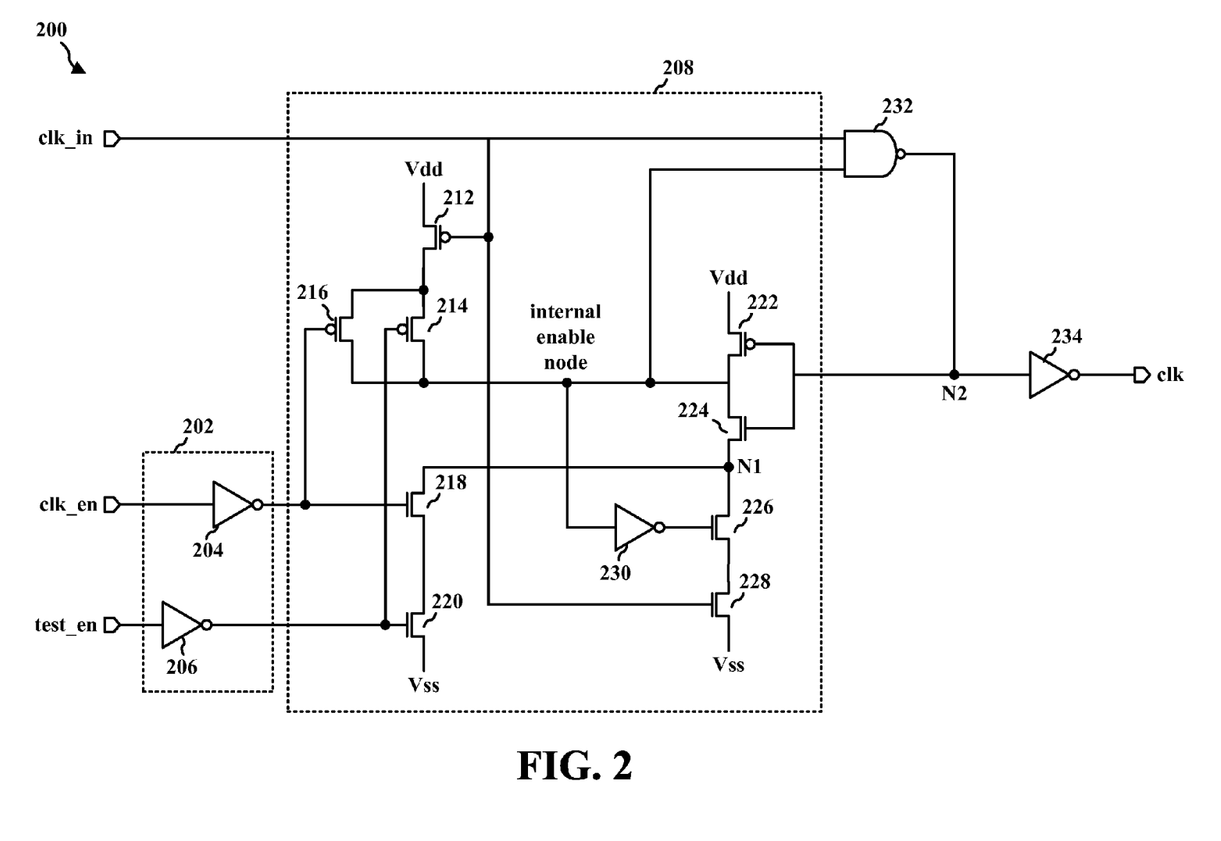
FIG. 2 is a circuit diagram of a clock-gating cell.

FIG. 2 is a circuit diagram of a CGC 200. As shown in FIG. 2, the CGC 200 includes an enable module 202 and a latch module 208. The enable module 202 includes an inverter 204 with input clk_en and an inverter 206 with input test_en. The latch module 208 includes pMOS transistors 212, 214, 216, and 222, nMOS transistors 218, 220, 224, 226, and 228, and an inverter 230. An output of the inverter 204 is coupled to a gate of the pMOS transistor 216 and a gate of the nMOS transistor 218. An output of the inverter 206 is coupled to a gate of the pMOS transistor 214 and a gate of the nMOS transistor 220. The pMOS transistors 216 and 214 are connected in parallel, with drains connected to an internal enable node and sources connected to a drain of the pMOS transistor 212. A source of the pMOS transistor 212 is connected to Vdd. The nMOS transistors 218 and 220 are connected in series, with a source of the nMOS transistor 220 connected to Vss, a drain of the nMOS transistor 220 connected to a source of the nMOS transistor 218, and a drain of the nMOS transistor connected to node N1. The clk_in and the internal enable node are input to a NAND gate 232. An output of the NAND gate 232 is connected to node N2. The node N2 is input to the gates of the pMOS transistor 222 and the nMOS transistor 224. The pMOS transistor 222 and the nMOS transistor 224 are connected together as an inverter, with a source of the pMOS transistor 222 connected to Vdd, a drain of the pMOS transistor 222 connected to the internal enable node and to the drain of the nMOS transistor 224, and a source of the nMOS transistor 224 connected to node N1. The nMOS transistors 226 and 228 are connected in series, with a drain of the nMOS transistor 226 connected to node N1, a source of the nMOS transistor 226 connected to a drain of the nMOS transistor 228, and a source of the nMOS transistor 228 connected to Vss. The internal enable node is input to the inverter 230. An output of the inverter 230 is connected to a gate of the nMOS transistor 226. Gates of the pMOS transistor 212 and the nMOS transistor 228 are connected to the clk_in. The node N2 is input to an inverter 234. An output of the inverter 234 is the clock output clk.

The CGC 200 of FIG. 2 occupies a greater area than necessary. A CGC is provided infra with respect to FIG. 3 that has a smaller area than the CGC 200 of FIG. 2.

Figure 3:
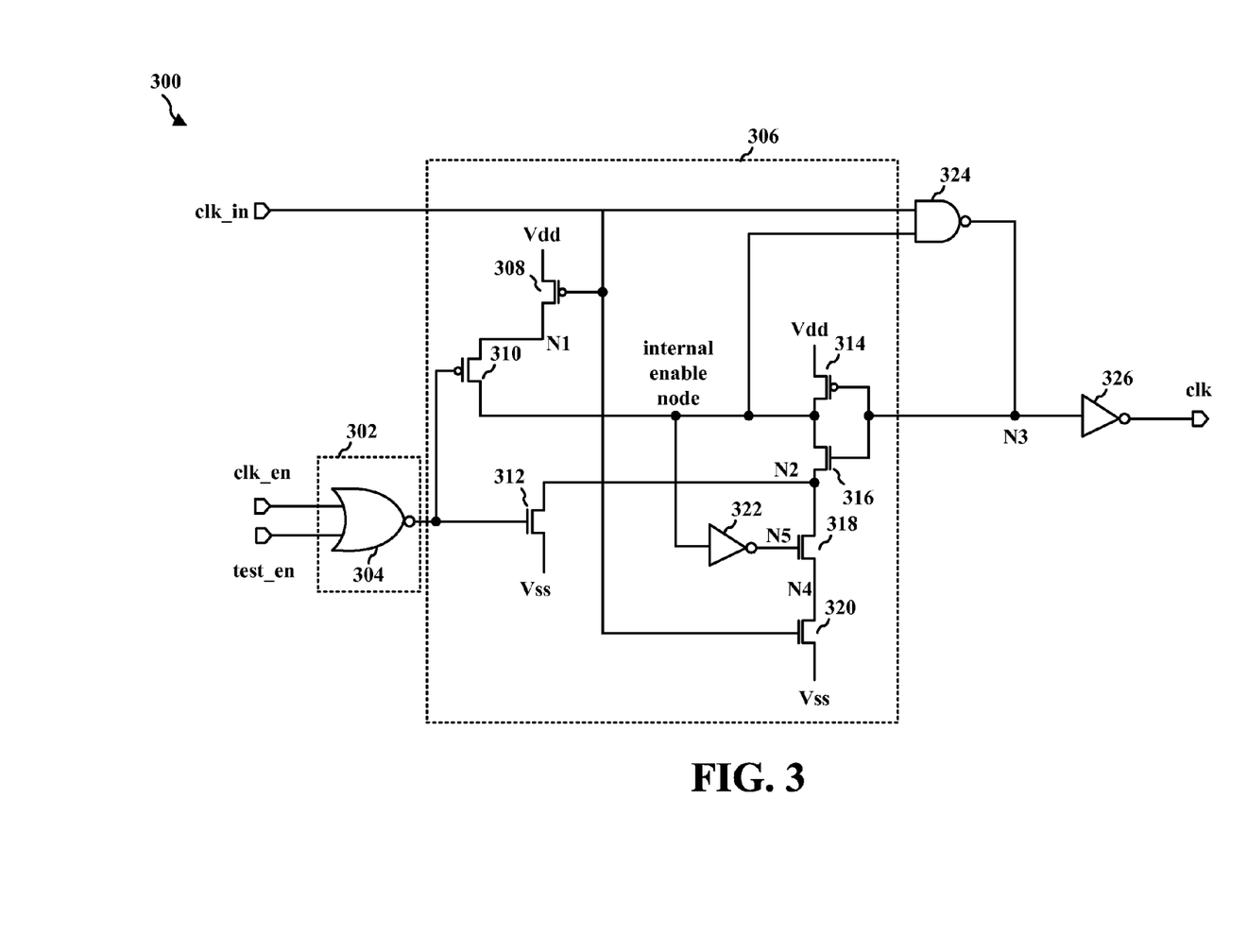
FIG. 3 is a circuit diagram of a first exemplary clock-gating cell.

FIG. 3 is a circuit diagram of a first exemplary CGC 300. As shown in FIG. 3, the CGC 300 includes an enable module 302 and a latch module 306. The enable module 302 includes a NOR gate 304 with inputs clk_en and test_en. The latch module 306 includes pMOS transistors 308, 310, and 314, nMOS transistors 312, 316, 318, and 320, and an inverter 322. An output of the NOR gate 304 is coupled to a gate of the pMOS transistor 310 and a gate of the nMOS transistor 312. A drain of the pMOS transistor 310 is connected to an internal enable node. A source of the pMOS transistor 310 is connected to node N1. A drain of the pMOS transistor 308 is also connected to node N1. A source of the pMOS transistor 308 is connected to Vdd. A source of the nMOS transistor 312 is connected to Vss. A drain of the nMOS transistor 312 is connected to node N2. The clk_in and the internal enable node are input to a NAND gate 324. An output of the NAND gate 324 is connected to node N3. The node N3 is input to the gates of the pMOS transistor 314 and the nMOS transistor 316. The pMOS transistor 314 and the nMOS transistor 316 are connected together as an inverter, with a source of the pMOS transistor 314 connected to Vdd, a drain of the pMOS transistor 314 connected to the internal enable node and to the drain of the nMOS transistor 316, and a source of the nMOS transistor 316 connected to node N2. The nMOS transistors 318 and 320 are connected in series, with a drain of the nMOS transistor 318 connected to node N2, a source of the nMOS transistor 318 connected to node N4 and to a drain of the nMOS transistor 320, and a source of the nMOS transistor 320 connected to Vss. The internal enable node is input to the inverter 322. An output of the inverter 322 is connected to node N5 and to a gate of the nMOS transistor 318. Gates of the pMOS transistor 308 and the nMOS transistor 320 are connected to the clk_in. The node N3 is input to an inverter 326. An output of the inverter 326 is the clock output clk.

The CGC 300 of FIG. 3 has two fewer transistors than the CGC 200 of FIG. 2. Both of the enable modules 202 and 302 have four transistors, but the input stage to the latch module 306 includes two less transistors than the input stage to the latch module 208. With fewer transistors, about a 5% area savings may be achieved. Further area savings to about 10% may be achieved through layout improvements, specifically, through the use of a continuous active region (oxide diffusion (OD) region) (which may not be used in the CGC 200 due to a layout limitation with the inverters 204 and 206) in the CGC 300. With a continuous active region, there are no shallow trench isolation (STI) and/or deep trench isolation (DTI) regions located between transistors within the cell, as the STI/DTI regions are located only on the edges of the cell.

Figure 4:
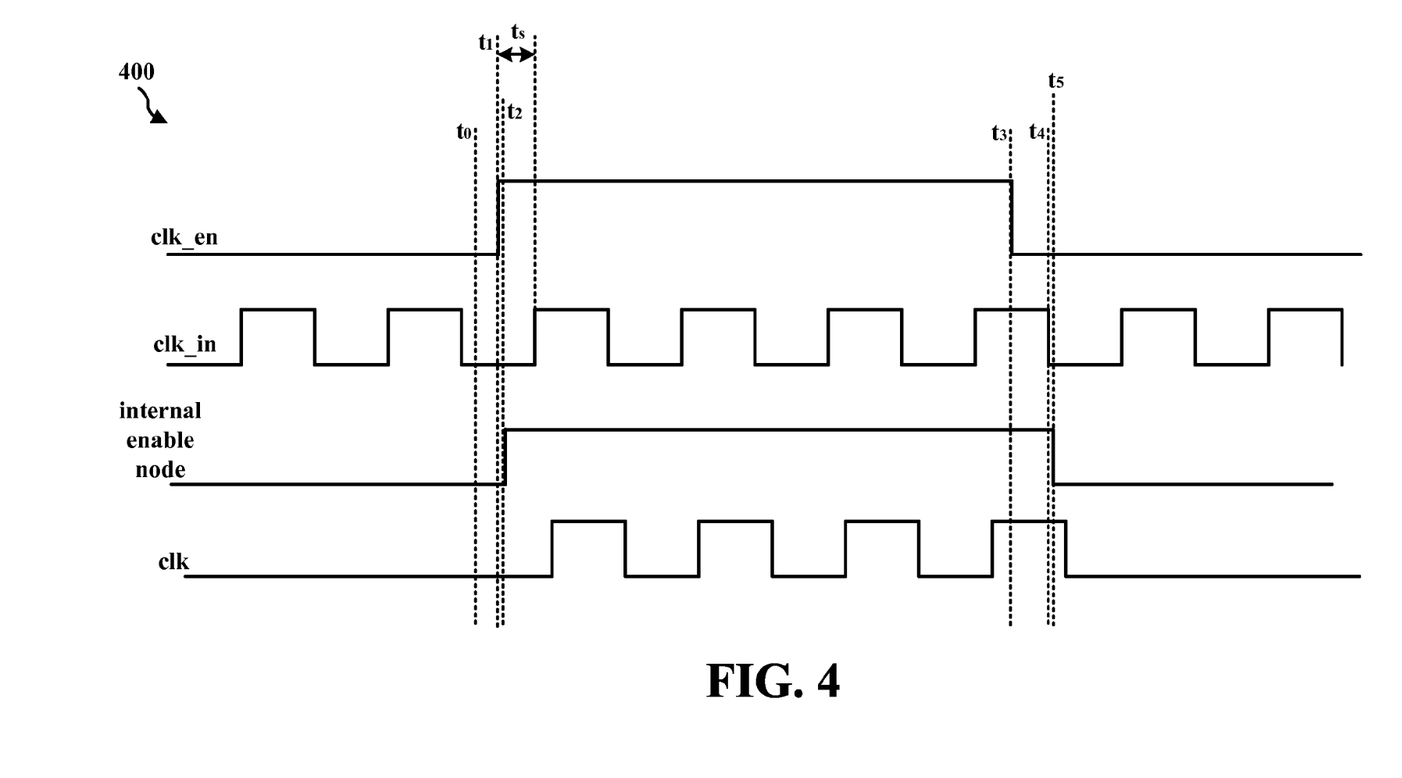
FIG. 4 is a timing diagram for the clock-gating cell of FIG. 3.

FIG. 4 is a timing diagram 400 for the CGC of FIG. 3. An operation of the CGC 300 will now be described with respect to the timing diagram of FIG. 4. At time $t_0$, the clk_en and test_en inputs are low, node N3 is high, and the internal enable node is low. At time $t_1$, clk_en goes high. With clk_en high, the nMOS transistor 312 is turned off, causing the source of the nMOS transistor 316 to float, and the pMOS transistor 310 is turned on. With the source of the nMOS transistor 316 floating, the internal enable node is able to go high, as only the pMOS transistor 314 is operational (the nMOS transistor 316 is nonoperational). With the clk_in being low, at time $t_2$, the pMOS transistors 308 and 310 drive the internal enable node high. Subsequently, the clk_in is passed through the NAND gate 324 and the inverter 326 as the clock output clk. After time $t_2$, when clk_in is high, the pMOS transistor 308 is turned off, and node N3 is low, which reinforces a high state at the internal enable node through the pMOS transistor 314. The high state at the internal enable node is kept high alternately through the pMOS transistor 314 and the pMOS transistor 308 based on the clk_in state.

At time $t_3$, clk_en goes low, which turns off the pMOS transistor 310 and turns on the nMOS transistor 312. With the nMOS transistor 312 on, the node N2 is low, thus making the nMOS transistor 316 operational again. At time $t_4$, when clk_in goes low, node N3 goes high, and at time $t_5$, the internal enable node is driven low by the nMOS transistor 316. When the internal enable node is low, the clk_in is disabled from passing through the NAND gate 324 to the inverter 326 and the clock output clk. With respect to the nMOS transistors 318 and 320, both of these transistors are on when the internal enable node is low and the clk_in is high. If the clk_en goes high while the clk_in is high, the nMOS transistors 318 and 320 operate to keep node N2 low until the clk_in goes low.

In this design, for the internal enable node to by driven high by the pMOS transistors 308 and 310, the clk_en must be high for a time period $t_s$ before the rising edge of the clk_in. The time period $t_s$ is the setup time. Specifically, when clk_en goes high, the pMOS transistor 310 is turned on. The pMOS transistor 308 is also turned on when the clk_in is low. For the internal enable node to be driven high, both the pMOS transistors 308 and 310 must be on for a time period $t_s$. As such, the clk_en must be high for a time period $t_s$ before the rising edge of the clk_in. In one example, the setup time $t_s$ for rising clk_en (rising arc) is 84 ps. The aforementioned setup time is for when clk_en goes high. When clk_en goes low, the clk_en must be low for a setup time period before the falling edge of the clk_in. In one example, the setup time for the falling clk_en (falling edge) is about 47 ps.

The first exemplary CGC 300 has the same rising arc (clk_en)/falling edge (clk_en) setup time as the CGC 200, but has a smaller area footprint than the CGC 200. Further, the CGC 300 uses less power than the CGC 200 as a result of having fewer transistors. A second exemplary CGC is provided infra with respect to FIG. 5 that has a smaller rising arc (clk_en) setup time than the CGC 200.

Figure 5:
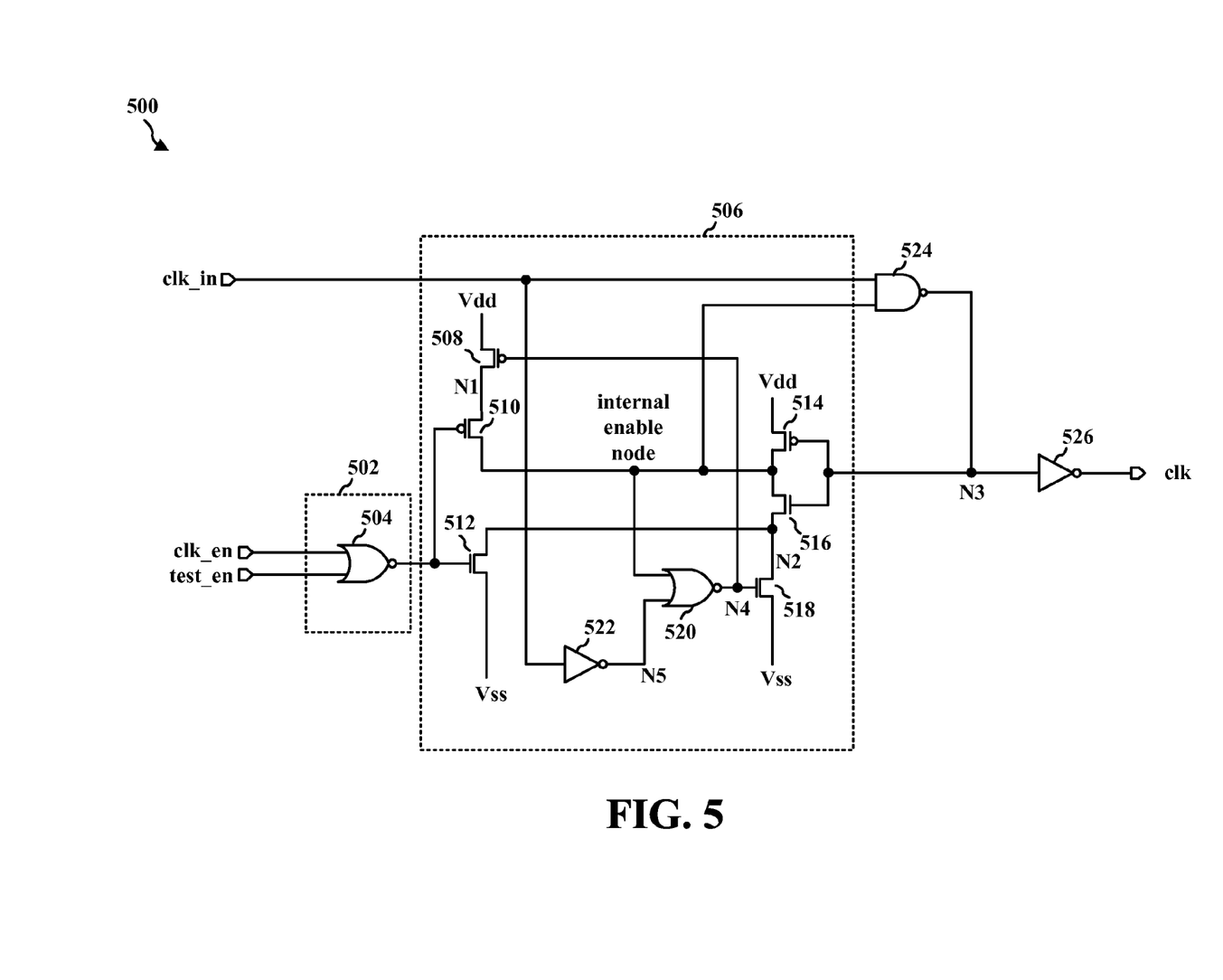
FIG. 5 is a circuit diagram of a second exemplary clock-gating cell.

FIG. 5 is a circuit diagram of a second exemplary CGC 500. As shown in FIG. 5, the CGC 500 includes an enable module 502 and a latch module 506. The enable module 502 includes a NOR gate 504 with inputs clk_en and test_en. The latch module 506 includes pMOS transistors 508, 510, and 514, nMOS transistors 512, 516, and 518, an inverter 522, and a NOR gate 520. An output of the NOR gate 504 is coupled to a gate of the pMOS transistor 510 and a gate of the nMOS transistor 512. A drain of the pMOS transistor 510 is connected to an internal enable node. A source of the pMOS transistor 510 is connected to node N1. A drain of the pMOS transistor 508 is also connected to node N1. A source of the pMOS transistor 508 is connected to Vdd. A source of the nMOS transistor 512 is connected to Vss. A drain of the nMOS transistor 512 is connected to node N2. The clk_in and the internal enable node are input to a NAND gate 524. An output of the NAND gate 524 is connected to node N3. The node N3 is input to the gates of the pMOS transistor 514 and the nMOS transistor 516. The pMOS transistor 514 and the nMOS transistor 516 are connected together as an inverter, with a source of the pMOS transistor 514 connected to Vdd, a drain of the pMOS transistor 514 connected to the internal enable node and to the drain of the nMOS transistor 516, and a source of the nMOS transistor 516 connected to node N2. The nMOS transistor 518 is connected between the node N2 and Vss, with a source of the nMOS transistor connected to Vss and a drain of the nMOS transistor connected to the node N2. The clk_in is input to the inverter 522. An output of the inverter 522 is connected to node N5. Both the node N5 and the internal enable node are input to the NOR gate 520. An output of the NOR gate 520 is connected to node N4 and to a gate of the nMOS transistor 518. The node N4 is connected to a gate of the pMOS transistor 508. The node N3 is input to an inverter 526. An output of the inverter 526 is the clock output clk.

Figure 6:
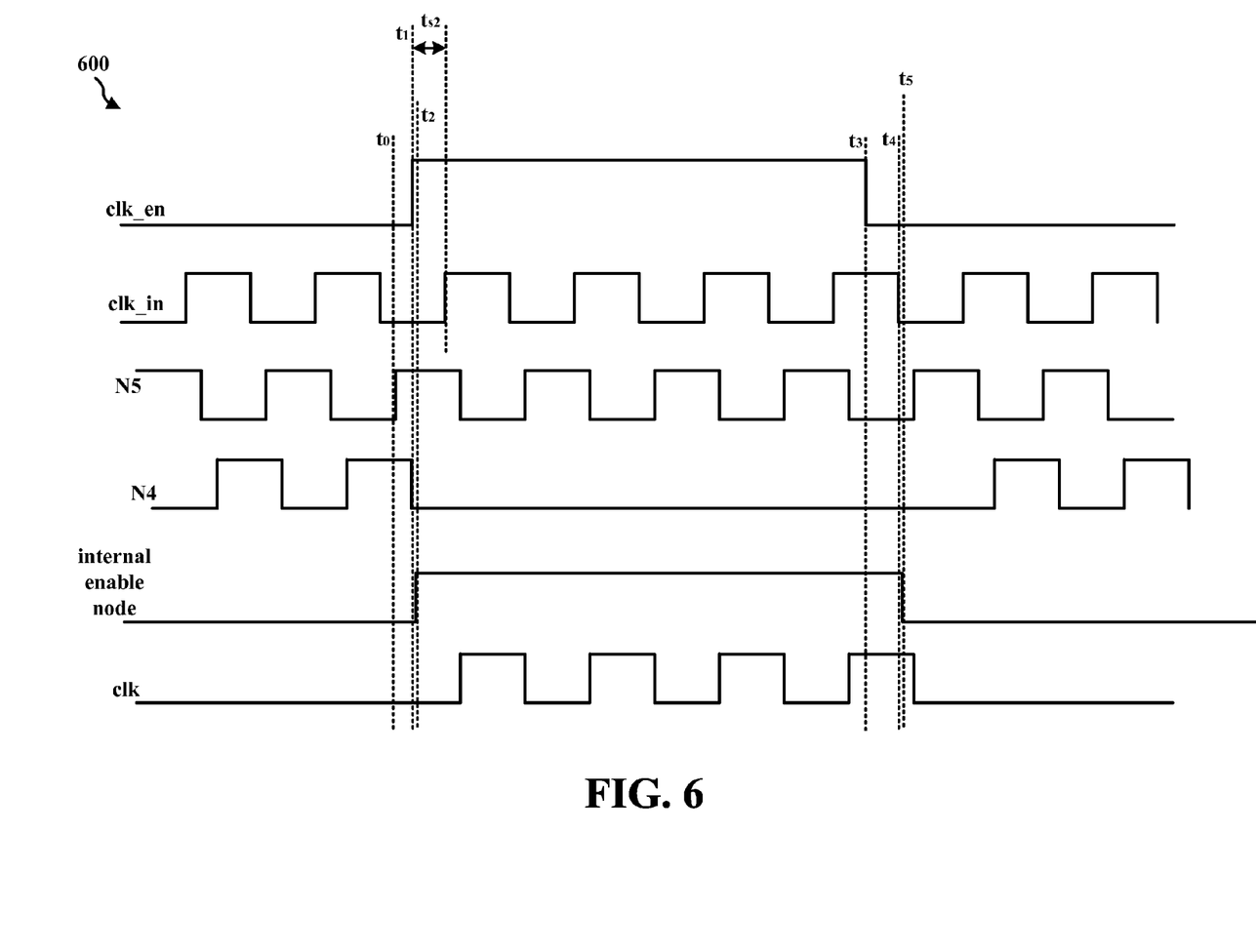
FIG. 6 is a timing diagram for the clock-gating cell of FIG. 5.

FIG. 6 is a timing diagram 600 for the CGC of FIG. 5. An operation of the CGC 500 will now be described with respect to the timing diagram of FIG. 6. At time $t_0$, the clk_en and test_en inputs are low, node N3 is high, and the internal enable node is low. At time $t_1$, clk_en goes high. With clk_en high, the nMOS transistor 512 is turned off, causing the source of the nMOS transistor 516 to float, and the pMOS transistor 510 is turned on. With the source of the nMOS transistor 516 floating, the internal enable node is able to go high, as only the pMOS transistor 514 is operational (the nMOS transistor 516 is nonoperational). With the clk_in being low, at time $t_2$, the pMOS transistors 508 and 510 drive the internal enable node high. Subsequently, the clk_in is passed through the NAND gate 524 and the inverter 526 as the clock output clk. After time $t_2$, when clk_in is high, the pMOS transistor 508 is turned off, and node N3 is low, which reinforces a high state at the internal enable node through the pMOS transistor 514. The high state at the internal enable node is kept high alternately through the pMOS transistor 514 and the pMOS transistor 508 based on the clk_in state.

At time $t_3$, clk_en goes low, which turns off the pMOS transistor 510 and turns on the nMOS transistor 512. With the nMOS transistor 512 on, the node N2 is low, thus making the nMOS transistor 516 operational again. At time $t_4$, when clk_in goes low, node N3 goes high, and at time $t_5$, the internal enable node is driven low by the nMOS transistor 516. When the internal enable node is low, the clk_in is disabled from passing through the NAND gate 524 to the inverter 526 and the clock output clk. With respect to the nMOS transistor 518, this transistor is on when the internal enable node is low and the clk_in is high. If the clk_en goes high while the clk_in is high, the nMOS transistor 318 operates to keep node N2 low until the clk_in goes low. In the CGC 500, the gate of the pMOS transistor 408 is connected to the node N4. The node N4 is functionally $\overline{EC}$, where E is the internal enable node and C is the clk_in (i.e., the inverse of the combination of the internal enable node E or the inverse of the clk_in C ($\overline{E+\overline{C}}$) is equal to $\overline{EC}$). As such, the pMOS transistor 408 is on when the internal enable node is high or the clk_in is low.

In this design, the clk_in has a propagation delay of $t_d$ through the inverter 522 and the NOR gate 520. As such, when the clk_in goes high, the node N4 will stay low for time $t_d$ longer, thus providing a reduced rising arc (clk_en) setup time $t_{s2}$. For the CGC 500, the rising arc (clk_en) setup time $t_{s2}=t_s-t_d$. In one example, the rising arc (clk_en) setup time $t_{s2}$ may be around 47 ps, which is approximately the same as the falling edge (clk_en) setup time. Accordingly, the CGC 500 has approximately symmetric rising arc/falling edge setup times.

The second exemplary CGC 500 has a reduced rising arc (clk_en) setup time as compared to the CGCs 200 and 300. However, the CGC 500 has a larger area footprint than the CGC 300, as the CGC 500 includes three additional transistors (four from the additional NOR gate 520 minus one because the transistor 320 is not included in the CGC 500). Further, the CGC 500 may have a larger area footprint than the CGC 200, as the CGC 500 includes one additional transistor than the CGC 200.

With reference to the CGCs 200, 300, and 500, the CGC 300 has a reduced area footprint as compared to the CGC 200 as a result of including fewer transistors. Further, additional reductions in area footprint may be obtained for the CGC 300 through the use of a continuous active region, as discussed supra. As such, the clock-tree area (clock distribution network area) may be reduced. With fewer transistors, the CGC 300 may also consume less power than the CGC 200. The CGC 300 may be used in non-critical paths to reduce the clock-tree area and the power consumption of the IC including such CGCs. The CGC 500 has a reduced rising arc (clk_en) setup time as compared to the CGCs 200 and 300. For the CGC 500, the rising arc/falling edge setup times are approximately symmetric. However, the CGC 500 may have a larger area footprint than the CGCs 200 and 300. Accordingly, the CGC 500 may be used in critical paths to improve the performance of the IC including such CGCs.

Referring again to FIG. 3, the CGC 300 includes an enable module 302 and a latch module 306. The enable module 302 includes a NOR gate 304 that receives an enable module input clk_en and test_en and has an enable module output. The latch module 306 has latch module inputs and a latch module output. The latch module inputs include a latch module clock input for receiving a clock clk_in and a latch module enable input for receiving the enable module output. The latch module enable input is coupled to the enable module output. The latch module 306 is configured to enable and to disable the clock clk_in via the latch module output based on the enable module input. The latch module 306 includes a first pMOS transistor 308 having a first pMOS transistor source, a first pMOS transistor drain, and a first pMOS transistor gate. The first pMOS transistor source is coupled to a first voltage source Vdd. The first pMOS transistor drain is coupled to a first node N1. The latch module 306 further includes a second pMOS transistor 310 having a second pMOS transistor source, a second pMOS transistor drain, and a second pMOS transistor gate. The second pMOS transistor source is coupled to the first node N1. The second pMOS transistor drain is coupled to an internal enable node. The internal enable node is the latch module output. The second pMOS transistor gate is coupled to the enable module output.

In one configuration, the enable module input includes at least two inputs including a clock enable input clk_en and a test enable input test_en. In one configuration, the latch module 306 further includes a first nMOS transistor 312 having a first nMOS transistor source, a first nMOS transistor drain, and a first nMOS transistor gate. The first nMOS transistor source is coupled to a second voltage source Vss. The first nMOS transistor drain is coupled to a second node N2. The first nMOS transistor gate is coupled to the enable module output. In one configuration, the CGC 300 further includes a NAND gate 324 having NAND gate inputs coupled to the clock and the internal enable node, and a NAND gate output coupled to a third node N3. In one configuration, the latch module 306 further includes a third pMOS transistor 314 having a third pMOS transistor source coupled to the first voltage source Vdd, a third pMOS transistor drain coupled to the internal enable node, and a third pMOS transistor gate coupled to a third node N3. The latch module 306 further includes a second nMOS transistor 316 having a second nMOS transistor source coupled to the second node N2, a second nMOS transistor drain coupled to the internal enable node, and a second nMOS transistor gate coupled to the third node N3. In one configuration, the CGC 300 further includes an inverter 326 coupled between the third node N3 and an output of the CGC. In one configuration, the first pMOS transistor gate is coupled to the clock clk_in. In one configuration, the latch module 306 further includes a third nMOS transistor 318 having a third nMOS transistor source coupled to a fourth node N4, a third nMOS transistor drain coupled to the second node N2, and a third nMOS transistor gate coupled to a fifth node N5. The latch module 306 further includes a fourth nMOS transistor 320 having a fourth nMOS transistor source coupled to the second voltage source Vss, a fourth nMOS transistor drain coupled to the fourth node N4, and a fourth nMOS transistor gate coupled to the clock clk_in. The latch module 306 further includes an inverter 322 coupled between the internal enable node and the fifth node N5.

Referring again to FIG. 5, the CGC 500 includes an enable module 502 and a latch module 506. The enable module 502 includes a NOR gate 504 that receives an enable module input clk_en and test_en and has an enable module output. The latch module 506 has latch module inputs and a latch module output. The latch module inputs include a latch module clock input for receiving a clock clk_in and a latch module enable input for receiving the enable module output. The latch module enable input is coupled to the enable module output. The latch module 506 is configured to enable and to disable the clock clk_in via the latch module output based on the enable module input. The latch module 506 includes a first pMOS transistor 508 having a first pMOS transistor source, a first pMOS transistor drain, and a first pMOS transistor gate. The first pMOS transistor source is coupled to a first voltage source Vdd. The first pMOS transistor drain is coupled to a first node N1. The latch module 506 further includes a second pMOS transistor 510 having a second pMOS transistor source, a second pMOS transistor drain, and a second pMOS transistor gate. The second pMOS transistor source is coupled to the first node N1. The second pMOS transistor drain is coupled to an internal enable node. The internal enable node is the latch module output. The second pMOS transistor gate is coupled to the enable module output. In one configuration, the first pMOS transistor gate is configured to receive functionally $\overline{EC}$, where E is the internal enable node and C is the clock clk_in.

Referring again to FIG. 5, the CGC 500 includes an enable module 502 having an enable module input and an enable module output, and a latch module 506 having latch module inputs and a latch module output. The latch module inputs include a latch module clock input for receiving a clock clk_in and a latch module enable input for receiving the enable module output. The latch module enable input is coupled to the enable module output. The latch module 506 is configured to enable and to disable the clock clk_in via the latch module output based on the enable module input. The latch module 506 includes an internal enable node that is the latch module output. The latch module 506 is configured to cause the internal enable node to transition from low to high as a function of the enable module output and $\overline{EC}$, where E is the internal enable node and C is the clock.

In one configuration, the latch module 506 includes a first pMOS transistor 508 having a first pMOS transistor source, a first pMOS transistor drain, and a first pMOS transistor gate. The first pMOS transistor source is coupled to a first voltage source Vdd. The first pMOS transistor drain is coupled to a first node N1. The latch module 506 further includes a second pMOS transistor 510 having a second pMOS transistor source, a second pMOS transistor drain, and a second pMOS transistor gate. The second pMOS transistor source is coupled to the first node N1. The second pMOS transistor drain is coupled to the internal enable node. The second pMOS transistor gate is coupled to the enable module output. The first pMOS transistor gate is configured to receive functionally $\overline{EC}$, where E is the internal enable node and C is the clock clk_in. In one configuration, the enable module includes a NOR gate 504. The NOR gate 504 receives the enable module input. The enable module input includes at least two inputs including a clock enable input clk_en and a test enable input test_en. In one configuration, the latch module 506 further includes a first nMOS transistor 512 having a first nMOS transistor source, a first nMOS transistor drain, and a first nMOS transistor gate. The first nMOS transistor source is coupled to a second voltage source Vss. The first nMOS transistor drain is coupled to a second node N2. The first nMOS transistor gate being coupled to the enable module output. In one configuration, the CGC 500 further includes a NAND gate 524 having NAND gate inputs coupled to the clock clk_in and the internal enable node, and a NAND gate output coupled to a third node N3. In one configuration, the latch module 506 includes a third pMOS transistor 514 having a third pMOS transistor source coupled to the first voltage source Vdd, a third pMOS transistor drain coupled to the internal enable node, and a third pMOS transistor gate coupled to a third node N3. The latch module 506 further includes a second nMOS transistor 516 having a second nMOS transistor source coupled to the second node N2, a second nMOS transistor drain coupled to the internal enable node, and a second nMOS transistor gate coupled to the third node N3. In one configuration, the CGC 500 further includes an inverter 526 coupled between the third node N3 and an output of the clock-gating cell. In one configuration, the latch module 506 further includes a third nMOS transistor 518 having a third nMOS transistor source coupled to the second voltage source Vss, a third nMOS transistor drain coupled to the second node N2, and a third nMOS transistor gate coupled to a fourth node N4. In one configuration, the first pMOS transistor gate is coupled to the fourth node N4. In one configuration, the latch module 506 further includes an inverter 522 coupled between the clock clk_in and a fifth node N5, and a NOR gate 520 having NOR gate inputs and a NOR gate output. The NOR gate inputs are coupled to the internal enable node and the fifth node N5. The NOR gate output is coupled to the fourth node N4.

Figure 7:
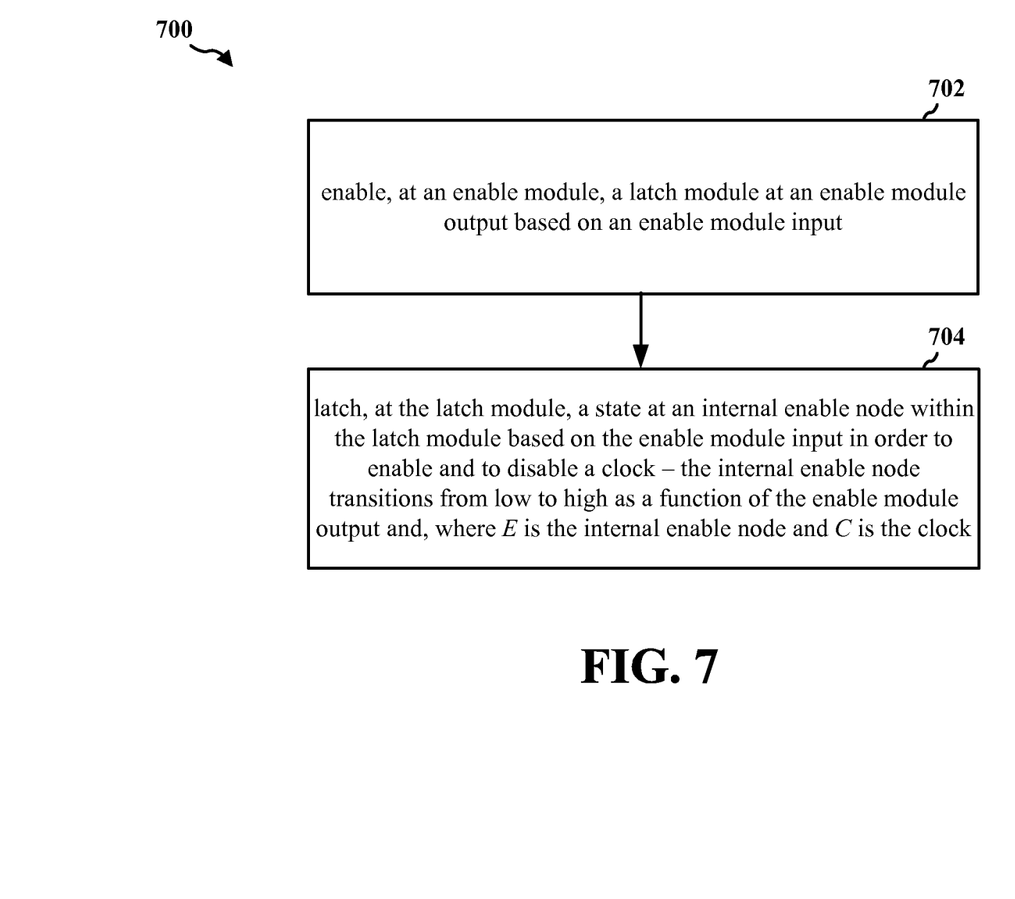
FIG. 7 is a flow chart of an exemplary method of a clock-gating cell.

FIG. 7 is a flow chart 700 of an exemplary method of a CGC. In one example, the method is performed by the CGC 500. At 702, the CGC 500 enables, at an enable module 502, a latch module 506 at an enable module output based on an enable module input. At 704, the CGC 500 latches, at the latch module 506, a state at an internal enable node within the latch module 506 based on the enable module input in order to enable and to disable a clock clk_in. The internal enable node transitions from low to high as a function of the enable module output and $\overline{EC}$, where E is the internal enable node and C is the clock clk_in.

In one configuration, the CGC 500 includes means for enabling (502) a means for latching (506) at an enable module output based on an enable module input. The CGC further includes means for latching (506) a state at an internal enable node within the means for latching (506) based on the enable module input in order to enable and to disable a clock clk_in. The internal enable node transitions from low to high as a function of the enable module output and $\overline{EC}$, where E is the internal enable node and C is the clock clk_in.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A clock-gating cell, comprising:
   an enable module comprising a NOR gate that receives an enable module input and has an enable module output; and
   a latch module having latch module inputs and a latch module output, the latch module inputs including a latch module clock input for receiving a clock and a latch module enable input for receiving the enable module output, the latch module enable input being coupled to the enable module output, the latch module being configured to enable and to disable the clock via the latch module output based on the enable module input,
   wherein the latch module comprises:
   a first p-type metal oxide semiconductor (pMOS) transistor having a first pMOS transistor source, a first pMOS transistor drain, and a first pMOS transistor gate, the first pMOS transistor source being coupled to a first voltage source, the first pMOS transistor drain being coupled to a first node; and
   a second pMOS transistor having a second pMOS transistor source, a second pMOS transistor drain, and a second pMOS transistor gate, the second pMOS transistor source being coupled to the first node, the second pMOS transistor drain being coupled to an internal enable node, the internal enable node being the latch module output, the second pMOS transistor gate being coupled to the enable module output, wherein the first pMOS transistor gate is configured to receive functionally $\overline{EC}$, where E is the internal enable node and C is the clock.

2. The clock-gating cell of claim 1, wherein the enable module input comprises at least two inputs including a clock enable input and a test enable input.

3. The clock-gating cell of claim 1, wherein the latch module further comprises a first n-type metal oxide semiconductor (nMOS) transistor having a first nMOS transistor source, a first nMOS transistor drain, and a first nMOS transistor gate, the first nMOS transistor source being coupled to a second voltage source, the first nMOS transistor drain being coupled to a second node, and the first nMOS transistor gate being coupled to the enable module output.

4. The clock-gating cell of claim 3, wherein the clock-gating cell further comprises a NAND gate having NAND gate inputs coupled to the clock and the internal enable node, and a NAND gate output coupled to a third node.

5. A clock-gating cell, comprising:
   an enable module comprising a NOR gate that receives an enable module input and has an enable module output; and
   a latch module having latch module inputs and a latch module output, the latch module inputs including a latch module clock input for receiving a clock and a latch module enable input for receiving the enable module output, the latch module enable input being coupled to the enable module output, the latch module being configured to enable and to disable the clock via the latch module output based on the enable module input,
   wherein the latch module comprises:
   a first p-type metal oxide semiconductor (pMOS) transistor having a first pMOS transistor source, a first pMOS transistor drain, and a first pMOS transistor gate, the first pMOS transistor source being coupled to a first voltage source, the first pMOS transistor drain being coupled to a first node;
   a second pMOS transistor having a second pMOS transistor source, a second pMOS transistor drain, and a second pMOS transistor gate, the second pMOS transistor source being coupled to the first node, the second pMOS transistor drain being coupled to an internal enable node, the internal enable node being the latch module output, the second pMOS transistor gate being coupled to the enable module output;
   a first n-type metal oxide semiconductor (nMOS) transistor having a first nMOS transistor source, a first nMOS transistor drain, and a first nMOS transistor gate, the first nMOS transistor source being coupled to a second voltage source, the first nMOS transistor drain being coupled to a second node, and the first nMOS transistor gate being coupled to the enable module output;
a third pMOS transistor having a third pMOS transistor source coupled to the first voltage source, a third pMOS transistor drain coupled to the internal enable node, and a third pMOS transistor gate coupled to a third node; and
a second nMOS transistor having a second nMOS transistor source coupled to the second node, a second nMOS transistor drain coupled to the internal enable node, and a second nMOS transistor gate coupled to the third node.

6. The clock-gating cell of claim 5, wherein the clock-gating cell further comprises an inverter coupled between the third node and an output of the clock-gating cell.

7. The clock-gating cell of claim 5, wherein the first pMOS transistor gate is coupled to the clock.

8. The clock-gating cell of claim 7, wherein the latch module further comprises:
a third nMOS transistor having a third nMOS transistor source coupled to a fourth node, a third nMOS transistor drain coupled to the second node, and a third nMOS transistor gate coupled to a fifth node;
a fourth nMOS transistor having a fourth nMOS transistor source coupled to the second voltage source, a fourth nMOS transistor drain coupled to the fourth node, and a fourth nMOS transistor gate coupled to the clock; and
an inverter coupled between the internal enable node and the fifth node.

9. A clock-gating cell, comprising:
an enable module having an enable module input and an enable module output; and
a latch module having latch module inputs and a latch module output, the latch module inputs including a latch module clock input for receiving a clock and a latch module enable input for receiving the enable module output, the latch module enable input being coupled to the enable module output, the latch module being configured to enable and to disable the clock via the latch module output based on the enable module input,
wherein the latch module includes an internal enable node that is the latch module output, and the latch module is configured to cause the internal enable node to transition from low to high as a function of the enable module output and a node of a function $\overline{E}$ AND C, where E is the internal enable node and C is the clock; and
a gate to enable and disable the clock by a function of EC.

10. A clock-gating cell, comprising:
an enable module having an enable module input and an enable module output; and
a latch module having latch module inputs and a latch module output, the latch module inputs including a latch module clock input for receiving a clock and a latch module enable input for receiving the enable module output, the latch module enable input being coupled to the enable module output, the latch module being configured to enable and to disable the clock via the latch module output based on the enable module input,
wherein the latch module includes an internal enable node that is the latch module output, and the latch module is configured to cause the internal enable node to transition from low to high as a function of the enable module output and a node of a function $\overline{E}$ AND C, where E is the internal enable node and C is the clock;
wherein the latch module further comprises:
a first p-type metal oxide semiconductor (pMOS) transistor having a first pMOS transistor source, a first pMOS transistor drain, and a first pMOS transistor gate, the first pMOS transistor source being coupled to a first voltage source, the first pMOS transistor drain being coupled to a first node; and
a second pMOS transistor having a second pMOS transistor source, a second pMOS transistor drain, and a second pMOS transistor gate, the second pMOS transistor source being coupled to the first node, the second pMOS transistor drain being coupled to the internal enable node, the second pMOS transistor gate being coupled to the enable module output,
wherein the first pMOS transistor gate is configured to receive functionally $\overline{E}$ AND C, where E is the internal enable node and C is the clock.

11. The clock-gating cell of claim 10, wherein the enable module comprises a NOR gate, the NOR gate receiving the enable module input, the enable module input comprising at least two inputs including a clock enable input and a test enable input.

12. The clock-gating cell of claim 10, wherein the latch module further comprises a first n-type metal oxide semiconductor (nMOS) transistor having a first nMOS transistor source, a first nMOS transistor drain, and a first nMOS transistor gate, the first nMOS transistor source being coupled to a second voltage source, the first nMOS transistor drain being coupled to a second node, and the first nMOS transistor gate being coupled to the enable module output.

13. The clock-gating cell of claim 12, wherein the clock-gating cell further comprises a NAND gate having NAND gate inputs coupled to the clock and the internal enable node, and a NAND gate output coupled to a third node.

14. The clock-gating cell of claim 12, wherein the latch module further comprises:
a third pMOS transistor having a third pMOS transistor source coupled to the first voltage source, a third pMOS transistor drain coupled to the internal enable node, and a third pMOS transistor gate coupled to a third node; and
a second nMOS transistor having a second nMOS transistor source coupled to the second node, a second nMOS transistor drain coupled to the internal enable node, and a second nMOS transistor gate coupled to the third node.

15. The clock-gating cell of claim 14, wherein the clock-gating cell further comprises an inverter coupled between the third node and an output of the clock-gating cell.

16. The clock-gating cell of claim 14, wherein the latch module further comprises a third nMOS transistor having a third nMOS transistor source coupled to the second voltage source, a third nMOS transistor drain coupled to the second node, and a third nMOS transistor gate coupled to a fourth node.

17. The clock-gating cell of claim 16, wherein the first pMOS transistor gate is coupled to the fourth node.

18. The clock-gating cell of claim 16, wherein the latch module further comprises:
an inverter coupled between the clock and a fifth node; and
a NOR gate having NOR gate inputs and a NOR gate output, the NOR gate inputs being coupled to the internal enable node and the fifth node, the NOR gate output being coupled to the fourth node.

19. A method of operation of a clock-gating cell, comprising:
enabling, at an enable module, a latch module at an enable module output based on an enable module input;
latching, at the latch module, a state at an internal enable node within the latch module based on the enable module input in order to enable and to disable a clock, wherein the internal enable node transitions from low to high as a function of the enable module output and a node of a function $\overline{E}$ AND C, where E is the internal enable node and C is the clock, and
wherein the clock is enabled or disabled via a gate of a function of EC.

20. A method of operation of a clock-gating cell, comprising:
enabling, at an enable module, a latch module at an enable module output based on an enable module input; and
latching, at the latch module, a state at an internal enable node within the latch module based on the enable module input in order to enable and to disable a clock, wherein the internal enable node transitions from low to high as a function of the enable module output and a node of a function $\overline{E}$ AND C, where E is the internal enable node and C is the clock, wherein the latch module comprises:
a first p-type metal oxide semiconductor (pMOS) transistor having a first pMOS transistor source, a first pMOS transistor drain, and a first pMOS transistor gate, the first pMOS transistor source being coupled to a first voltage source, the first pMOS transistor drain being coupled to a first node; and
a second pMOS transistor having a second pMOS transistor source, a second pMOS transistor drain, and a second pMOS transistor gate, the second pMOS transistor source being coupled to the first node, the second pMOS transistor drain being coupled to the internal enable node, the second pMOS transistor gate being coupled to the enable module output, and
wherein the first pMOS transistor gate is configured to receive functionally $\overline{E}$ AND C.

21. The method of claim 20, wherein the enable module comprises a NOR gate, the NOR gate receiving the enable module input, the enable module input comprising at least two inputs including a clock enable input and a test enable input.

22. The method of claim 20, wherein the latch module further comprises a first n-type metal oxide semiconductor (nMOS) transistor having a first nMOS transistor source, a first nMOS transistor drain, and a first nMOS transistor gate, the first nMOS transistor source being coupled to a second voltage source, the first nMOS transistor drain being coupled to a second node, and the first nMOS transistor gate being coupled to the enable module output.

23. The method of claim 22, wherein the clock-gating cell further comprises a NAND gate having NAND gate inputs coupled to the clock and the internal enable node, and a NAND gate output coupled to a third node.

24. The method of claim 22, wherein the latch module further comprises:
a third pMOS transistor having a third pMOS transistor source coupled to the first voltage source, a third pMOS transistor drain coupled to the internal enable node, and a third pMOS transistor gate coupled to a third node; and
a second nMOS transistor having a second nMOS transistor source coupled to the second node, a second nMOS transistor drain coupled to the internal enable node, and a second nMOS transistor gate coupled to the third node.

25. A clock-gating cell, comprising:
means for enabling a means for latching at an enable module output based on an enable module input;
means for latching a state at an internal enable node within the means for latching based on the enable module input in order to enable and to disable a clock, wherein the internal enable node transitions from low to high as a function of the enable module output and a node of a function $\overline{E}$ AND C, where E is the internal enable node and C is the clock; and
a gate to enable and disable the clock by a function of EC.

26. A clock-gating cell, comprising:
means for enabling a means for latching at an enable module output based on an enable module input; and
means for latching a state at an internal enable node within the means for latching based on the enable module input in order to enable and to disable a clock, wherein the internal enable node transitions from low to high as a function of the enable module output and a node of a function $\overline{E}$ AND C, where E is the internal enable node and C is the clock, wherein the means for latching comprises:
a first p-type metal oxide semiconductor (pMOS) transistor having a first pMOS transistor source, a first pMOS transistor drain, and a first pMOS transistor gate, the first pMOS transistor source being coupled to a first voltage source, the first pMOS transistor drain being coupled to a first node; and
a second pMOS transistor having a second pMOS transistor source, a second pMOS transistor drain, and a second pMOS transistor gate, the second pMOS transistor source being coupled to the first node, the second pMOS transistor drain being coupled to the internal enable node, the second pMOS transistor gate being coupled to the enable module output, and
wherein the first pMOS transistor gate is configured to receive functionally $\overline{E}$ AND C.

27. The clock-gating cell of claim 26, wherein the means for enabling comprises a NOR gate, the NOR gate receiving the enable module input, the enable module input comprising at least two inputs including a clock enable input and a test enable input.

28. The clock-gating cell of claim 26, wherein the means for latching further comprises a first n-type metal oxide semiconductor (nMOS) transistor having a first nMOS transistor source, a first nMOS transistor drain, and a first nMOS transistor gate, the first nMOS transistor source being coupled to a second voltage source, the first nMOS transistor drain being coupled to a second node, and the first nMOS transistor gate being coupled to the enable module output.

29. The clock-gating cell of claim 28, wherein the means for latching further comprises:
a third pMOS transistor having a third pMOS transistor source coupled to the first voltage source, a third pMOS transistor drain coupled to the internal enable node, and a third pMOS transistor gate coupled to a third node; and
a second nMOS transistor having a second nMOS transistor source coupled to the second node, a second nMOS transistor drain coupled to the internal enable node, and a second nMOS transistor gate coupled to the third node.

* * * * *